United States Patent
Lee et al.

(10) Patent No.: US 6,574,152 B1
(45) Date of Patent: Jun. 3, 2003

(54) CIRCUIT DESIGN FOR ACCEPTING MULTIPLE INPUT VOLTAGES FOR FLASH EEPROM MEMORY OPERATIONS

(75) Inventors: Peter W. Lee, Saratoga, CA (US); Fu-Chang Hsu, San Jose, CA (US); Hsing-Ya Tsao, San Jose, CA (US)

(73) Assignee: Aplus Flash Technology, Inc., San Jose, CA (US)

( * ) Notice: Subject to any disclaimer, the term of this patent is extended or adjusted under 35 U.S.C. 154(b) by 0 days.

(21) Appl. No.: 10/104,736

(22) Filed: Mar. 22, 2002

Related U.S. Application Data

(60) Provisional application No. 60/280,342, filed on Mar. 30, 2001.

(51) Int. Cl.[7] .................................................. G11C 7/00
(52) U.S. Cl. ............................ 365/189.11; 365/185.018; 365/189.01
(58) Field of Search ........................ 365/189.11, 185.18, 365/189.09, 185.33, 189.01, 241, 242

(56) References Cited

U.S. PATENT DOCUMENTS

| | | | |
|---|---|---|---|
| 5,748,538 A | 5/1998 | Lee et al. | 365/185.06 |
| 5,848,000 A | 12/1998 | Lee et al. | 365/185.23 |
| 6,081,460 A * | 6/2000 | Lim et al. | 365/189.11 |

* cited by examiner

Primary Examiner—David Lam
(74) Attorney, Agent, or Firm—George O. Saile; Stephen B. Ackerman

(57) ABSTRACT

In the present invention an EEPROM flash memory is operated using the I/O pins of an EPROM. A novel circuit is used that allows a plurality of voltages to be applied at different times to a single pin designated as CEB (chip enable bar) that permits reading and writing of the flash memory chip. The plurality of voltages can range from a positive voltage, to a ground voltage and to a negative voltage. When a positive voltage like Vdd is applied to the the CEB pin the chip is disabled and entered into a standby mode. When a ground voltage is applied to the CEB pin, the flash memory chip is enabled and a read operation can be performed. When a high negative voltage is applied to the CEB pin, the circuit of the present invention produces an internal high negative voltage to be used for a write operation.

25 Claims, 5 Drawing Sheets

FIG. 4 – Prior Art int_pad
CIRCUIT DESIGN FOR ACCEPTING MULTIPLE INPUT VOLTAGES FOR FLASH EEPROM MEMORY OPERATIONS The instant application claims priority to U.S. Provisional Application Ser. No. 60/280,342 filed Mar. 30, 2001, which is herein incorporated by reference.

BACKGROUND OF THE INVENTION

1. Field of the Invention

The present invention relates to semiconductor memories and in particular a a circuit for multiple input voltages for use with EEPROM flash memory.

2. Description of the Related Art

High voltage charge pump circuits and area consuming state machines are built into flash EEPROM memory chips for systems requiring programmability. The use of these chips in systems that do not require programmability are a waste of space and result in increased die cost and noise. For EPROM memories there are no requirements for high voltage charge pump circuits and on chip state machines. Any data changes for EPROM memory relies on electrical program and ultra-violet (UV) light erase operations. The UV erase changes the threshold voltage Vt to a low state and requires a costly package with a quartz window to allow the UV light to reach the surface of the chip die.

After a predetermined UV erase time of around 15 minutes, the electrons will be ejected out of the floating gate of all EPROM cells. This results in the Vt of all cells to be lowered to approximately ±1.2V resulting in a logical "1". The UV erase operation is similar to chip erase in a flash EEPROM. After UV erase, any selected data change from "1" to "0" requires an electric program operation. The program operation is done by either a high current channel hot electron (CHE), or by low current Fowler Nordheim (FN) schemes. For a CHE program, a positive high voltage ranging from +10V to +12V is required. By contrast, FN program operation requires a negative high voltage ranging from −10V to −12V. For today's low voltage single power supply memory, a positive high voltage is generated from an on chip charge pump. High voltage supply pins, like VPP as required in traditional EPROM memory, are removed from the standard pin configuration of a flash EEPROM. The negative high voltage supply VNN is not needed for the traditional EPROM memory and is created on chip for the flash EEPROM. The VNN can be used either for FN program or erase operations. The penalty for on chip positive and negative charge pumps is an increase in die area and cost. In addition, on chip charge pumps generate substantial noise, which degrades the system performance and causes operation failures at low chip bias voltage Vdd.

U.S. Pat. No. 5,848,000 (Lee et al.) is directed toward the use of a plurality of voltage terminals to receive a plurality of voltages to facilitate accurate and flexible read, erase and program operations for a flash memory. U.S. Pat. No. 5,748,538 (Lee et al.) is directed toward providing a flash electrically erasable programmable read only memory (EEPROM), where writing, e.g. erasing and programming, of a selected cell uses an FN tunneling method.

For those applications requiring no in system programmability and having a strong demand for low die cost and low noise, the on chip charge pumps and state machine must be removed. Therefore, off chip positive (VPP) and negative (VNN) high voltage power supplies are required. Also, adding VNN to any existing selective pins of an EPROM, a pin compatibility for JEDEC standard has to be maintained.

SUMMARY OF THE INVENTION

An object of the present invention is to remove the on chip high voltage negative and positive charge pumps thereby eliminating the noise and achieving stability of a low Vdd operation and with the negative high voltage VNN being supplied from an external pin for the erase operation;

Another object of the present invention is to remove the on chip state machine to reduce the die area and required circuit design for cost reduction;

A further objective of the present invention is to add VNN to the preferred pin set of the traditional EPROM, and thereby meeting full compatibility in the read operation for those applications requiring no in system programmability;

Still a further objective of the present invention is to add VNN to the preferred pin set of a standard EPROM and maintain the JEDEC standard;

Still another further objective of the invention is to provide a novel input circuit solution that can accept three voltages for different operations of flash EEPROM in MTP (multiple time programmable memories) application using the same package pin and without a costly package using a quartz window.

The present invention teaches a novel input circuit design that can accept more than three supplied voltages for different operations of EEPROM flash memory using the same package pin. These voltages include a first voltage of positive power supply VDD, or any positive voltage; a second voltage of ground level, or Vss; and a third voltage of a negative power supply VNN, or any negative voltage. The voltages VDD, VSS and VNN are supplied to the same input pad for different flash operations at different times. For example, in one embodiment, the VNN, VDD and VSS are supplied to the CEB pin of an EPROM memory. In this EPROM memory, CEB pin is traditionally used as a chip enable pin.

When VDD is connected to the CEB pin, the EPROM chip is disabled and is set into the standby mode. In this condition, the chip will not consume any power and all input and output buffers are disabled. The output buffers are in tri-stated (high impedance) state. When ground is connected to the CEB pin, the chip is enabled. The output buffers are released from tri-state mode and output their stored data. Unlike a UV-EPROM, an electric erase operation is needed for data change for the flash memory. In accordance with the present invention, the electric erase operation requires a negative high voltage which is supplied to the CEB pin. This negative high voltage is approximately around −10V, or less, to allow flash cells to perform an FN erase operation, which is also required in other flash operation such as erase verify.

The operating principles of the three voltage input circuit of the present invention is described in reference to FIG. 1 through FIG. 6. The three different voltages include a first voltage of positive power supply VDD, or any positive voltage; a second voltage of ground level of VSS; and a third voltage of negative power supply VNN, or any negative voltage. According to the present invention, VDD, VSS and VNN are all supplied to the same chip input pad for different flash operations at different times. In order to be consistent with traditional EPROM devices, the selection of the pad for the three voltage input circuit can be used for CEB (chip enable bar), OEB (output enable bar), PGMB (program bar), or other functions depending on the density of the memory.

The design targets of the present invention are: 1) To select a traditional EPROM's pin that can be added to the erase function and make the pin a multiple-function pin. The preferred pin selection is varied for different density of EPROM memory. 2) To allow the selected pin to accept more than three voltages such as VDD, VSS and VNN, or other voltages between VDD and VNN. Where VDD is the positive power supply, VSS is the ground voltage, and VNN is the external negative power supply of around −10V for performing a write operation. The write operation requires the external negative supply of VNN for either program or erase operations according to the present invention. 3) To allow the selected multi-function pin to provide proper external voltages for either read or write operations. For example, when the read function depends on the selected pin, CEB is selected to couple VNN to the chip. Then during the read operation the multi-function pin functions as CEB (Chip-Enable-Bar) to control enable or disable of the chip. During an erase operation the multi-function pin is used to connect a high negative voltage, such as VNN, to the chip. 4) to allow the requirement of device breakdown to be kept below IVNNI+VDD, where IVNNI is defined as the absolute value of the VNN voltage. With VNN=−10V and VDD=+3V, the breakdown voltage of IVNNI+VDD is 13V. 5) to allow the multi-function pin VNN/GEB to consume zero standby current during a read operation.

In summary, a total of three voltages, positive, ground and negative, are designed to be coupled to the same input pin, CEB, of a flash memory. The preferred circuit of the present invention connected to the CEB pin is designed to handle the three voltages, to consume zero DC power during a read operation and to be free from breakdown during erase operation.

BRIEF DESCRIPTION OF THE FIGURES

This invention will be described with reference to the accompanying drawings, wherein.

DETAILED DESCRIPTION OF THE PREFERRED EMBODIMENT

The operating principles of the three input voltage circuit of the present invention will be described with reference to FIG. 1 through FIG. 6. The three different voltages include a first voltage of positive power supply VDD or any positive voltage, a second voltage of ground level of VSS and a third voltage of a negative power supply VNN or any negative voltage. VDD, VSS and VNN are supplied to the same input pad of a flash memory chip for different flash operations at different time. Thus allowing an EEPROM operation using a pin set of an EPROM. A negative high voltage, VNN, is externally supplied to be used to perform either FN program or FN erase operations depending upon the flash technologies. Program and erase operations are referred to as write operation subsequently in the present invention for simplified description. On-chip charge pumps and the state machine are removed to save area, cost and noise reduction.

Figure 1:
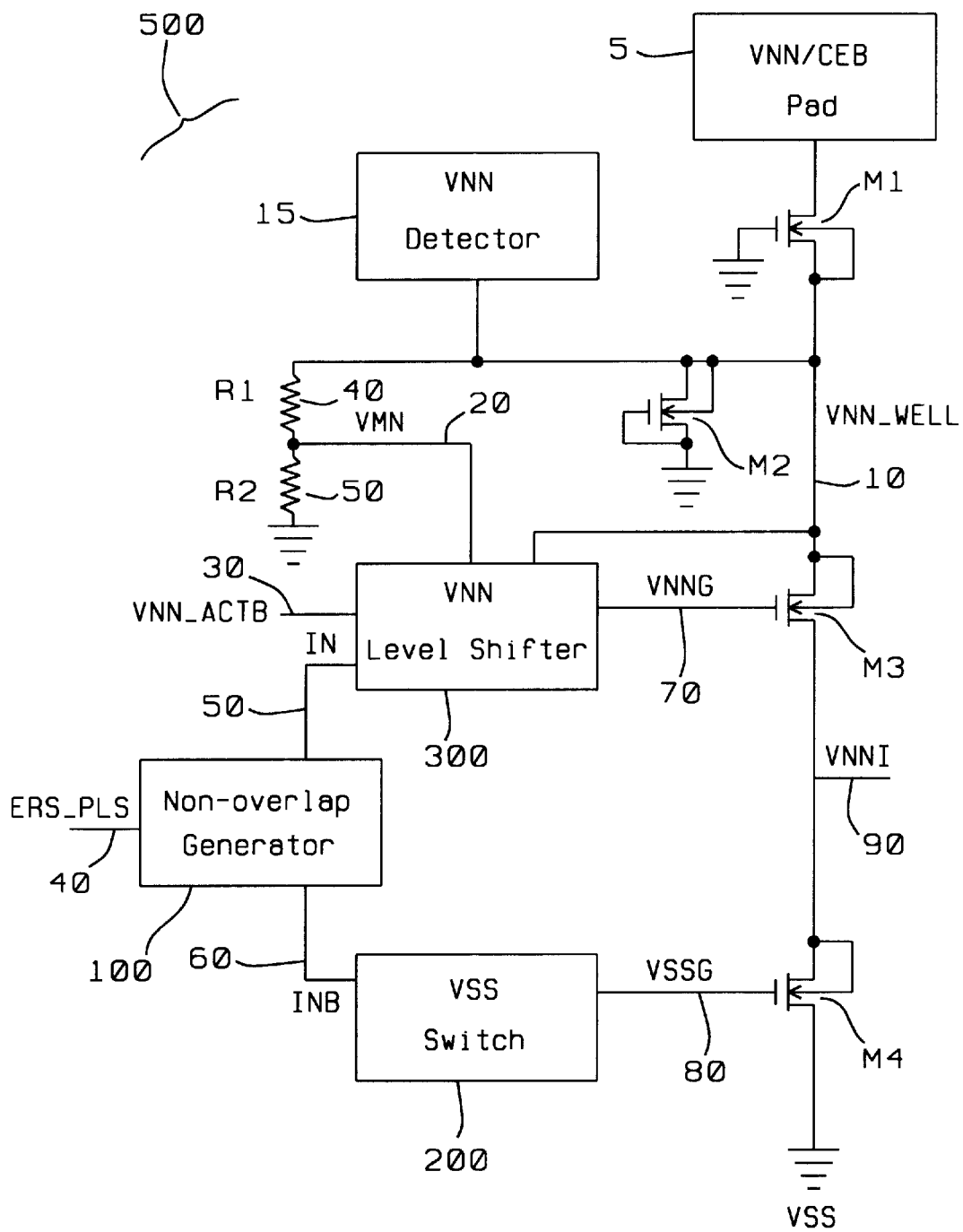
FIG. 1 shows the three voltage input circuit of the present invention.

FIG. 1 shows the overall diagram of the three voltage input circuit. The external input pad is referred as VNN/CEB pad. The circuit connected to the VNN/CEB pad is an input buffer with multiple input functions for different operations. VNN is the negative high voltage supply for write operation and CEB is the chip enable input for read operation. The output of the circuit is VNNI, which produces voltage switching between VSS and VNN during Write operation. During a read operation, VNNI is logically connected to CEB. In either read or write operation, the switching of VNNI between VSS and VNN can be achieved by properly controlling the VNN level shifter 300 and the VSS switch 200. The non-overlap generator 100 is used to control the switching so that the peak current flowing from the VNN/CEB pad to VSS is substantially reduced with little resulting noise. The resistor divider comprising resistors 40 and 50 connected in series provide an intermediate negative voltage less than VNN for protecting devices from breakdown in the VNN level shifter 300 during a write operation. The VNN_ACTB 30 signal is used to enable the write operation. The ERS_PLS 40 is a signal input that controls switching between VNN and VSS whenever the presence of VNN is detected.

In FIG. 1 is shown a preferred embodiment of the present invention in which CEB (chip enable bar) is selected to select the VNN voltage in accordance with the present invention. The VNN/CEB pad 5 is the regular CEB pad of an EPROM memory in a read operation. The selection makes the pin configuration of the flash chip fully compatible with the JEDEC standard of the traditional EPROM memory. The VNN/CEB pad 5 is the only external input pin of this circuit, which couples to the proper voltage supplied from the external pad for multiple operations at different times. When pad 5 is coupled with VNN, a VNN detector 15 will switch the flash memory chip into a write operation. When VNN of −10V is present on the VNN/CEB pad 5, the detector will generate a same phase signal of 0V called VNN_ACTB 30. When VNN toggles either from VDD or VSS to VNN, VNN_ACTB 30 will toggle from VDD to VSS accordingly. The circuit output, VNNI 90, will become the internal VNN supply source.

Continuing to refer to FIG. 1, during a read operation, the VNN/CEB pad 5 operates as CEB. When CEB is coupled to ground level, the chip is enabled for a read operation. When CEB is coupled to a VDD level, the chip is powered down and operating current is shut off to below 1 uA. During write operation, the VNN/CEB pad 5 operates as a VNN pad. The VNN/CEB pad 5 becomes the negative high-voltage power supply during a write operation. The NMOS device M1 with the semiconductor bulk tied to the source node 10 is made in a P-well within an N-well on P-substrate to avoid leakage current due to a forward junction induced by a read operation. Transistor M1 isolates the internal node of VNN_WELL 10 from the VNN/CEB pad 10 during a read operation. As a result, there is no DC current that will flow from VNN/CEB pad 5 to ground through the resistor divider R1 (40) and R2 (50). The standby current is less than 1 uA.

Continuing to refer to FIG. 1, during a write operation, the VNN/CEB pad operates as VNN. VNN_ACTB detects the presence of the VNN signal of approximately −10V during the write operation. When VNN is −10V, both VNN_WELL (10) and VNNI (90) become −10V. When the signal of VNN_ACTB is at a ground level, and the chip will enter into a write operation. ERS_PLS 40 is designed to control the pre-determined write time for a write operation. During a write operation, ERS_PLS stays at a VDD level. The preferred write time depends on the chosen flash technology for the product. The Write time could vary from 1 ms to several hundred ms, depending on memory size for the write operation. The higher the density of the flash memory for a write operation, the longer the write time that is required. The purpose of resistor divider R1 (40) and R2 (50) is to generate a medium negative voltage VMN 20 to protect the devices in the VNN level shifter 300 and as well as M3 during a write operation. As an example, VMN is designed to be around −2V when VNN is −10V. The −2V is generated from the resistor divider comprising of 800K ohm for R1 (40) and 200K ohms for R2 (50) when the VNN_WELL 10 is at −10V during a write operation. The values of R1 and R2 are optimized to reduce the write current flowing from the VNN/CEB pad 5 to VSS. The use of the multiple input voltage circuit 500 allows an on chip negative charge pump and a state-machine to be removed from the flash memory chip to save area and cost, and reduce noise.

Continuing to refer to FIG. 1, the VNN level shifter 300 and VSS switch 200 are both controlled by the non-overlap generator 100, which is driven by ERS_PLS 40. During a write operation, the VNN level shifter 300 is used to connect VNNI 90 to VNN_WELL 10 and thereby coupling −10V to VNNI. During a read operation, VMMI 90 is connected to VSS by the VSS switch 200. Since M3 and M4 are designed to be big devices for better speed, non-overlap switching of M3 and M4 is required to reduce the transient current from VNN/WELL to VSS. The non-overlap operation is controlled by the non-overlap generator 100. The non-overlap generator 100 is optimized to prevent transistors M3 and M4 from being turned on simultaneously. This is achieved by controlling both VNNG 70 and VSSG 80 to not be at a high level at the same time.

Figure 2:
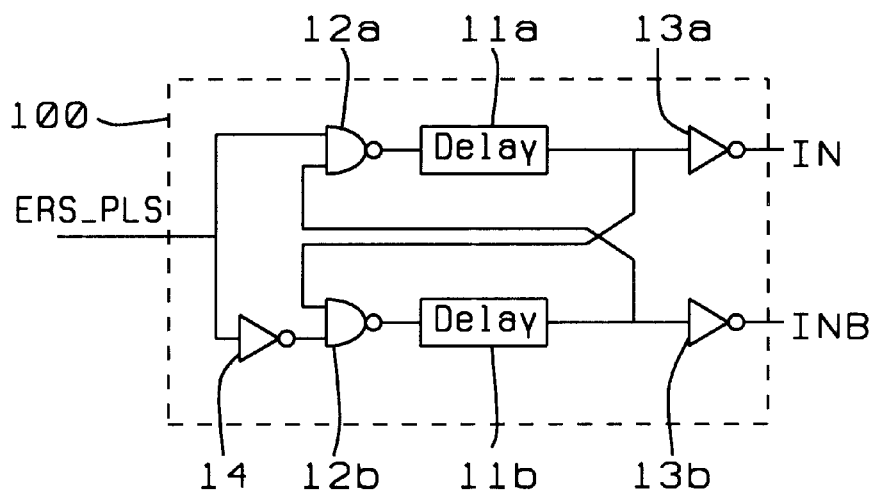
FIG. 2 shows the diagram of the non-overlap generator of the present invention.

In FIG. 2 a detailed circuit diagram of a non-overlap generator 100 is shown. The delay 11a and 11b are designed to ensure that no overlapped period exists for the IN and INB signals in order to eliminate the large peak transient current flowing from VNN/CEB to VSS when the circuit toggles from a read to a write operation or vise versa. The IN 50 and INB 60 signals are directly coupled to the inputs of VNN level shifter 300 and VSS switch 200 as shown in FIG. 1. The input of the non-overlap generator is connected to ERS_PLS 40, which is the signal used to control the predetermined write period for a write operation.

Continuing to refer to FIG. 2, the non-overlap generator 100 comprises of two NAND circuits 12a and 12b, three inverters 14, 13a and 13b, two delays 11a and 11b, two outputs IN and INB, and one input ERS_PLS. The delay circuits 11a and 11b are designed to ensure there is no period of overlap for the signals of IN and INB during the switching from read to write, or vise versa. This eliminates a large peak transient current flowing from VNN/CEB pad 5 to VSS when there is a toggle from read to write operations, or vise versa. The outputs of the non-overlap generator 100, IN and INB, are directly coupled to the input 50 of the VNN level shifter 300 and input 60 of the VSS Switch 200. The ERS_PLS signal is used to control the predetermined write period for a write operation. During a read operation, ERS_PLS is kept at ground level, and while in a write operation, ERS_PLS is kept at VDD level to facilitate write time control.

Figure 3:
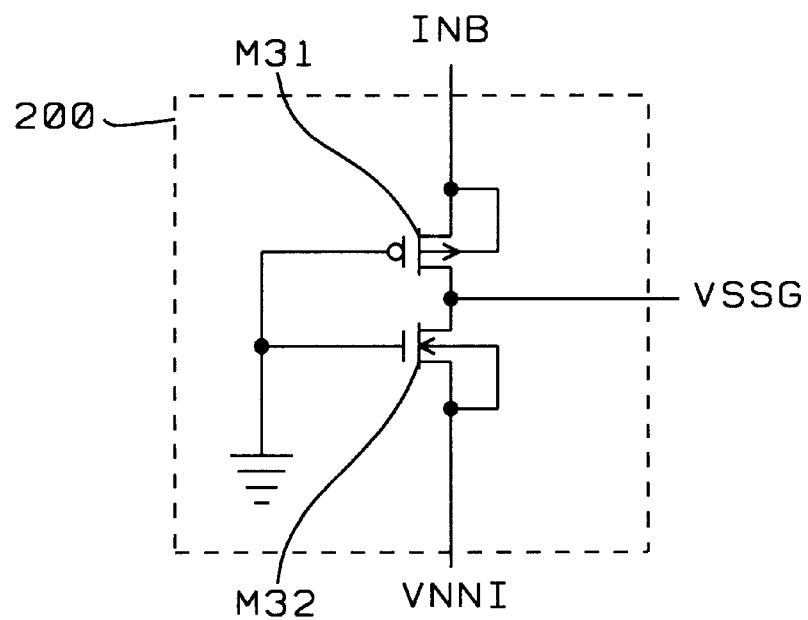
FIG. 3 shows the detailed circuit of the VSS switch of the present invention.

In FIG. 3 is shown a detailed circuit of the VSS switch 200. It comprises a PMOS transistor M31 with a source connecting to INB in series with a NMOS transistor M32 with a source connected to VNNI. The output VSSG is connected to the gate of transistor M4, shown in FIG. 1. The common gate of transistors M31 and M32 is grounded and common output of the transistors is coupled to VSSG. Transistor M32 is a NMOS device formed in an N-well on a P-substrate to avoid a forward biased junction during a write operation. The signal of INB switches between VDD and VSS, while VSSG switches between VDD and VNNI.

Continuing to refer to FIG. 3, the Vss switch circuit comprises a PMOS transistor M31 with source connecting to INB. Transistor M31 is in series with an NMOS transistor M32 with a source connected to VNNI. The INB input signal is coupled to the output of the non-overlap generator 100. The output VSSG 80 of the VSS switch circuit 200 is connected to the gate of M4 as shown in FIG. 1. The gates of transistors M31 and M32 are grounded and the common output is tied to VSSG. Transistor M32 is a NMOS device formed in an N-well on P-substrate to avoid leakage current caused by a forward junction during a write operation. The signal of INB switches between VDD and VSS, while VSSG switches between VDD and VNNIDuring a read operation, the VSS switch circuit 200 consumes no current.

Continuing to refer to FIG. 3, When the input INB is VDD and VNNI is VSS, VSSG is VDD. When INB is switched to VSS, transistor M31 is turned off. Then when VNNI is made negative, transistor M32 is turned on and the negative voltage on VNNI is passed to VSSG. This creates less voltage stress for transistor M31, which has a voltage of VSS-VNNI. Otherwise if INB is left at VDD, the voltage stress on transistor 31 will be much larger, VDD-VNNI.

Figure 4:
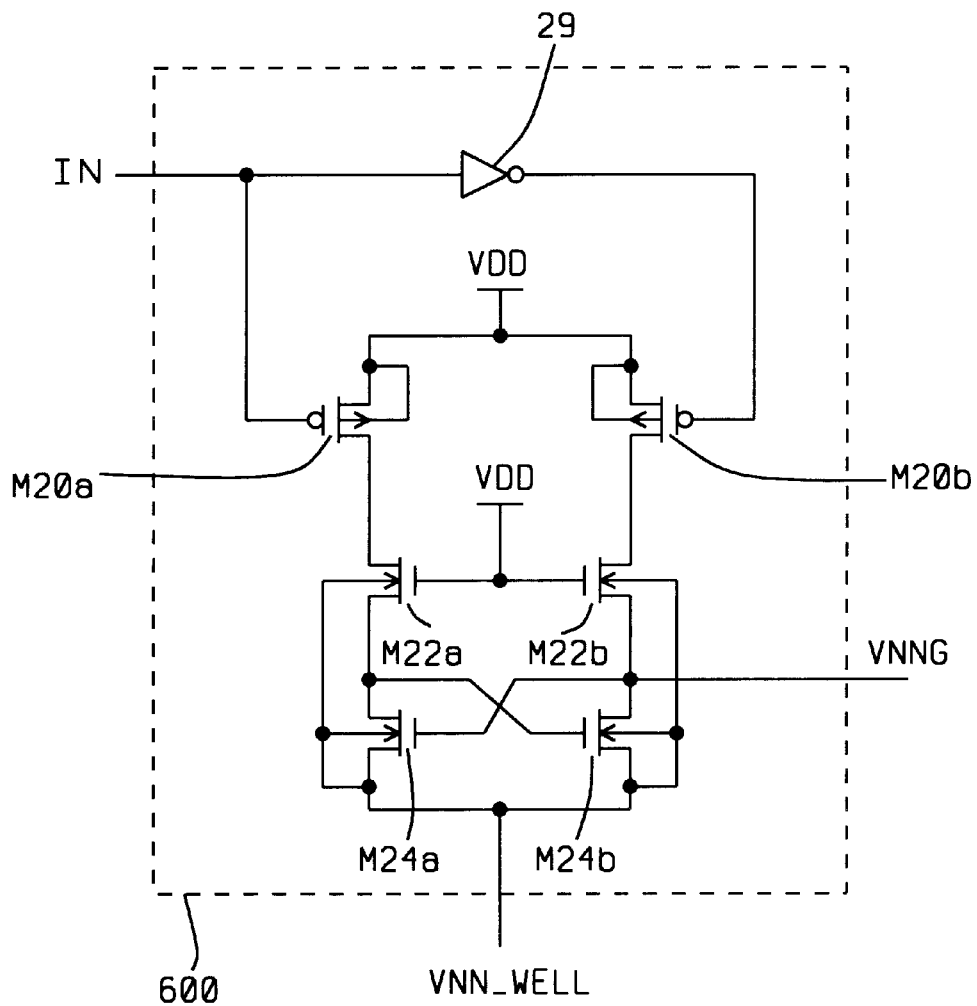
FIG. 4 shows a VNN level shifter design of prior art.

In FIG. 4 is shown a VNN level shifter circuit 600 of prior art. The single input IN is referred to as "in toggling" between VDD to VSS. The output VNNG is referred to as VNNG switching between VNN and VDD. This circuit is intended to shift the output voltage from VDD to VSS to VNN to VDD. The drawback of this prior art design is that a higher device breakdown voltage is required. For example, If VNN is −10V and VDD is 3V, the requirement for device breakdown voltage is 13V for all devices of M20a, M20b, M22a, M22b, M24a and M24b.

Figure 5:
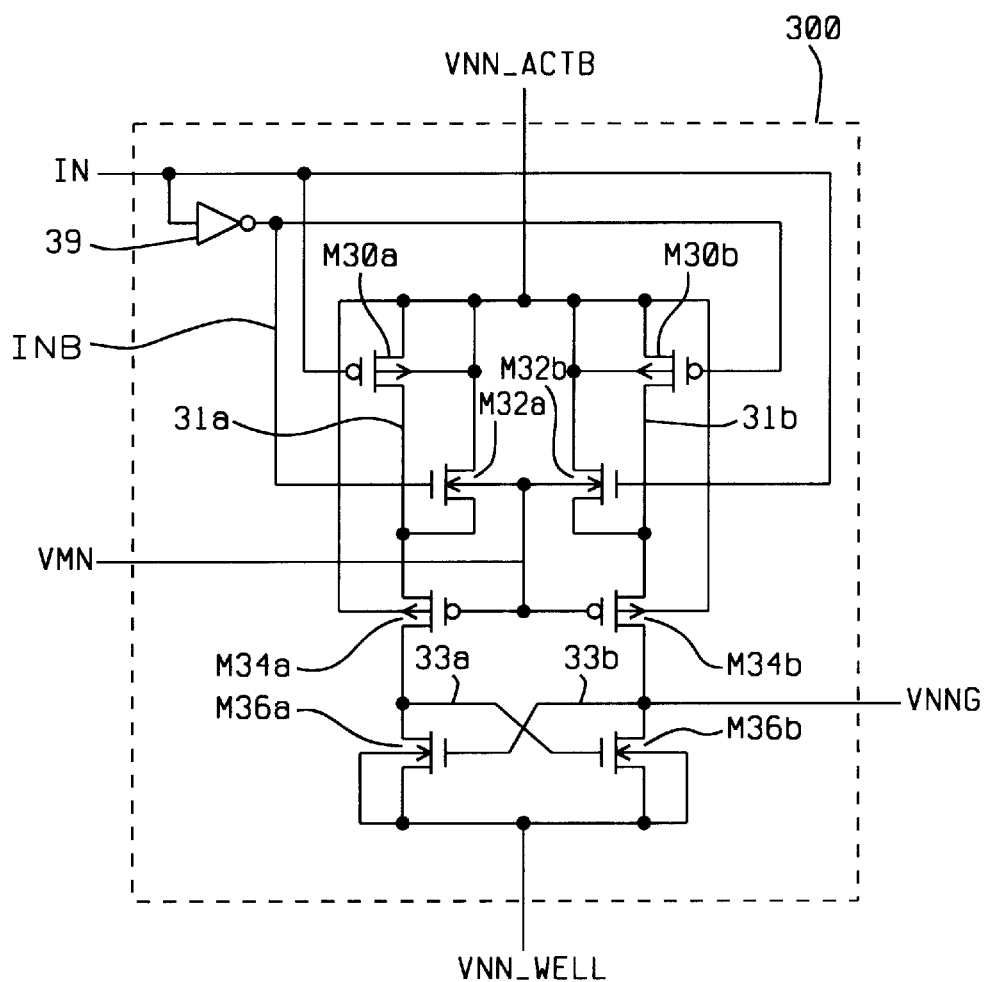
FIG. 5 shows the novel VNN level shifter of the present invention.

In FIG. 5 is shown a novel VNN level shifter 300 which requires lower device breakdown voltage than prior art. Instead of single input, three inputs are used to achieve the requirement of lower device breakdown voltages. The three inputs include VMN, IN and VNN_ACTB. Instead of VDD being directly connected to the gates of M34a and M34b, a medium negative voltage VMN is used to lower the voltage drop across M34a and M34b during write operation. The output VNNG is designed to toggle between VSS and VNN levels, instead of toggling between VDD and VNN levels as with the prior art.

Continuing to refer to FIG. 5, the novel VNN level shifter requires a lower device breakdown voltage of 10V. Instead of a single input as with the prior art shown in FIG. 4, three inputs, IN, VMN and VNN_ACTB, are included in the circuit of FIG. 5 to achieve the requirement of lower device breakdown voltages. Unlike the prior art of FIG. 4, where VDD is directly connected to the gates of M22a and M22b, a medium negative voltage VMN in FIG. 5 replaces VDD and is connected to the gates of M34a and M34b to lower the voltage drop across transistors M34a and M34b during a write operation. The output VNNG is designed to toggle between VSS and VNN levels, instead of toggling between VDD and VNN levels.

During erase or write operation, the voltage inputs of the level shifter, VNN_ACTB goes to VSS and VNN_WELL goes negative (e.g.−10V). The output voltage VNNG of the level shifter is switched between VSS and −10V under the control of input signal IN. An inverter 39 is used to invert the input signal IN and generate a signal INB at the output of the inverter circuit 39. Signal IN is connected to the gates of transistors M30a and M32b, and signal INB is connected to the gates of transistors M32a and M30b. Assuming IN is a high voltage VDD, and INB is a low voltage VSS, then during an erase or write operation, when the source voltage VNN_ACTB goes to VSS, the PMOS transistors M30a and M30b cannot be turned on by their gate voltages IN and INB, respectively, and do not control the switching of the level shifter 300. The level shifter is switched by the NMOS transistor M32a and M32b, because IN and INB can turn on transistors M32b and M32a, respectively.

Continuing to refer to FIG. 5, assuming IN is VDD, it will strongly turn on the NMOS transistor M32b, and pull the level of node 31b up to VSS since VNN_ACTB is VSS. When VMN is applied with a negative voltage (e.g. –2V), both PMOS transistors M34a and M34b are turned on. Node 33b will be charged to VSS by transistor M34b. Node 33b will turn on NMOS transistor M36a to discharge the node 33a to the negative voltage (e.g. –10V) of VNN_WELL. The voltage of node 33a then turns off the NMOS transistor M36b, so that there is no leakage current flowing from node 33b to VNN_WELL through transistor M36b. Node 33a will pass –10V to node 31a through transistor M34a. Because the threshold voltage of PMOS transistor M34a drops, node 31a will be discharged to VMN+Vtp, approximately –1.3V (when VMN is –2V and Vtp is 0.7V).

Continuing to refer to FIG. 5, because voltage INB is VSS, the NMOS transistor M32a will be turned on, which drives node 31a to VSS–Vtn=–0.7V when Vtn is 0.7V. Therefore, the voltage of node 31a is either –1.3V or –0.7V depending on the PMOS transistor M34a and the NMOS transistor M32a. The device sizes of transistors M34a and M32a are selected to limit the leakage current. In this way, all the voltages in nodes 31a, 33a, 31b, and 33b are between VNN_ACTB (0V) and VNN_WELL (–10V), and source to drain voltage stress is always less than 10V. Compared with the prior art shown in FIG. 4, which has a source to drain voltage of 10V+VDD, the present invention significantly reduces the device breakdown voltage requirement. The purpose of adding the source follower devices PMOS transistors M34a and M34b is to clamp the voltage of nodes 31a and 31b, otherwise node 31a will be discharged to –10V and cause a large leakage current to flow through the NMOS transistor M32a.

Continuing to refer to FIG. 5, during normal operation, ANN_ACTB returns to VDD and VNN_WELL returns to VSS, and the PMOS transistors M30a and M30b can be turned on or turned off by IN and INB. The input VMN is applied with VSS (0V) to turn on the PMOS transistors M34a and M34b. The PMOS transistors M30a and M30b, long with the cross-coupled NMOS transistors M36a and M36b form a conventional level shifter allowing the output signal VNNG to be switched between VNN_ACTB (VDD) and VNN_WELL (VSS) during the normal operation.

Figure 6:
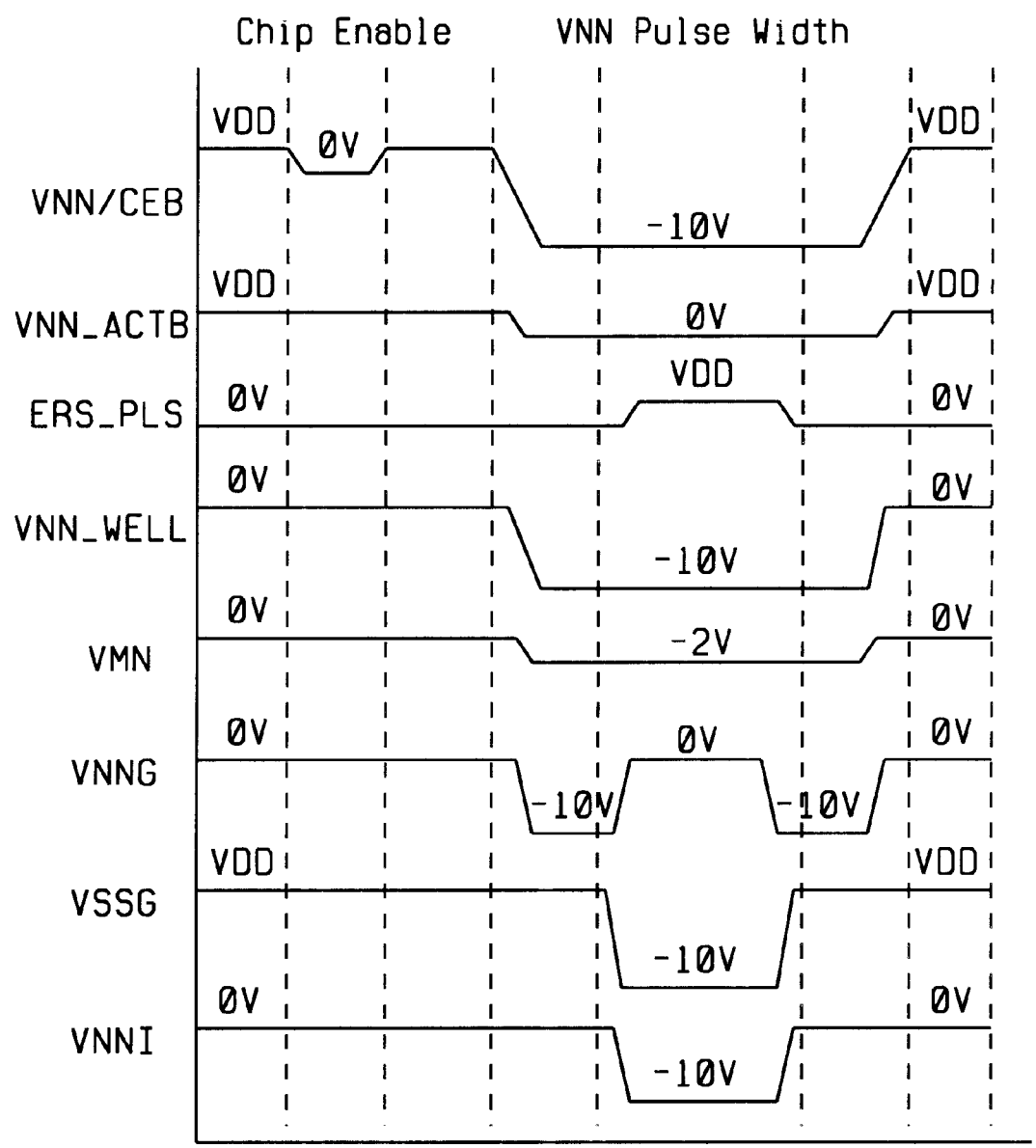
FIG. 6 shows the simulation waveforms for the circuit of FIG. 1.

FIG. 6 shows simulation waveforms for the circuit of FIG. 1. Four different voltages levels, –10V, –2V, 0V and VDD, are shown for the various waveforms. VDD varies from 1.8V to 5V. The VNN/CEB waveform shows the use of three of the voltage levels for three different operations, VDD for chip disable, 0V for chip enable and a read operation, and –10V for a write operation. The VNN_ACTB waveform shifts from VDD to 0V when entering a write operation so that the transistors in the level shifter circuit 300 are prevented from breakdown. The ERS_PLS waveform, which is the signal that controls the write period, is shown with a VDD pulse of defined width. The VNN_WELL waveform shows a change from 0V to –10V when a voltage of –10V is applied to the VNN/CEB pad to initiate a write operation. The VMN waveform is shown switching from 0V to –2V when the VNN/CEB signal goes to a –10V, which lowers the voltage drop across transistors M34a and M34b during a write operation. The waveform VNNG (output of the level shifter 300) is shown switching from 0V to –10V when –10v is applied to VNN/CEB pad 5, then switching to 0V when ERS_PLS switches to VDD to initiate a write operation. The waveform VNNG switches back to –10V when the write operation is completed and before the –10V is removed from the VNN/CEB pad 5, and finally switches back to 0V when –10V is removed from the VNN/CEB pad 5. The output of the switch 200 is shown in the VSSG waveform, which switches to –10V when a written operation is initiated by signal ERS_PLS. The output VNNI of the VNN/CEB circuit of the present invention is shown switching from 0V to –10V under the timing control of ERS_PLS, which controls the write period for a write operation.

While the invention has been particularly shown and described with reference to preferred embodiments thereof, it will be understood by those skilled in the art that various changes in form and details may be made without departing from the spirit and scope of the invention.

What is claimed is:

1. A circuit for accepting a plurality of control voltages on a same signal pad of a semiconductor chip, comprising:
   a) a semiconductor chip with a voltage control pad,
   b) a circuit connected to said control pad,
   c) a plurality of voltages connected to said control pad,
   d) each voltage of said plurality of voltages connected to said control pad at separate times,
   d) said circuit interprets which voltage is connected to said control pad and provides an internal signal to said semiconductor chip.

2. The circuit of claim 1, wherein the semiconductor chip is an flash memory chip with an EPROM pin configuration and with electronic erase and program capability.

3. The circuit of claim 1, wherein said chip pad is pin compatible with a JEDEC standard for EPROM memory chips.

4. The circuit of claim 1, wherein a high negative voltage is connected to said control pad as one of said plurality of voltages thereby establishing a write operation.

5. The circuit of claim 4, wherein said high negative voltage allows an erase operation without a high negative voltage charge pump internal to said semiconductor chip.

6. The circuit of claim 1, wherein a positive voltage is connected to said control pad as one of said plurality of voltages thereby inhibiting said chip.

7. The circuit of claim 1 wherein zero volts is connected to said control pad, thereby establishing a read operation in which said circuit consumes zero DC power during said read operation.

8. The circuit of claim 1 wherein said circuit reduces current transients between said control pad and circuit ground which result from switching between said plurality of voltages.

9. A circuit to allow a flash memory chip using an EPROM pin format to operate a fashion like an EEPROM, comprising:
   a) a chip pin of a flash memory chip that is compatible with a JEDEC standard for EPROM memory chips,
   b) a circuit connected to said chip pin that interprets a plurality of external voltages applied to said chip pin,
   c) said circuit produces a plurality of internal voltages to said flash memory chip to perform memory operations as a result of said interpretation of said plurality of external applied voltages.

10. The circuit of claim 9, wherein said chip pin is a JEDEC chip enable bar (CEB) pin.

11. The circuit of claim 9, wherein said circuit interprets an external applied positive voltage to said chip pin and inhibits said flash memory chip.

12. The circuit of claim 9, wherein said circuit interprets an external applied zero voltage to said chip pin and enables a read operation in said flash memory chip.

13. The circuit of claim 9, wherein said circuit interprets an external applied negative voltage to said chip pin and supplies an internal negative voltage to said flash memory chip to perform write operation.

14. The circuit of claim 9, wherein the external voltage detection and interpretation by said circuit allows the flash memory chip to be erased and programmed without the use of positive or negative charge pumps internal to said memory chip.

15. The circuit of claim 9, wherein said circuit isolates said chip pin from internal circuitry of said chip and consumes zero current during a read operation.

16. The circuit of claim 9 wherein said circuit reduces current transients on said chip pin resulting from switching between said plurality of voltages.

17. A circuit means for using a single chip pin for a plurality of voltage inputs, comprising:
   a) a means for applying a plurality of external voltages to a control pin of a chip,
   b) a means for interpreting a polarity and magnitude of said plurality of external voltages applied to said control pin,
   c) a means for creating an internal chip voltage corresponding to the polarity and magnitude of said external applied voltage,
   d) a means for isolating said pin from internal circuitry of said chip,
   e) a means for switching between applied voltages in a manner that reduces current transients at said control pin.

18. The circuit means of claim 17, wherein said means for applying a plurality of external voltages to said control pin comprises a negative voltage, a positive voltage and a ground voltage.

19. The circuit means of claim 17, wherein said chip is a flash memory chip with a writing means and an EPROM pin configuration means.

20. The circuit means of claim 19, whereby said writing means is accomplished when a high negative voltage is coupled to said control pin and thereby creating a high negative internal chip voltage required for a write operation.

21. The circuit means of claim 17, wherein said means for isolating said pin from the internal circuitry is done when said external voltage is zero and thereby activating a read operation.

22. A method for reading and writing a flash memory chip using an EPROM pin configuration, comprising:
   a) connecting a voltage detecting circuit to a chip enable bar (CEB) pin of an EPROM pin configuration for a flash memory chip,
   b) coupling a plurality of voltages to said CEB pin at different times and which further comprises a positive voltage, a zero voltage and a high negative voltage,
   c) detecting said high negative voltage coupled to said CEB pin and then creating an internal high negative voltage for writing cells of said flash memory chip,
   d) detecting said zero volts coupled to said CEB pin and then reading said flash memory chip,
   e) detecting said positive voltage coupled to said CEB pin and then inhibiting said flash memory chip.

23. The method of claim 22, wherein said voltage detecting circuit switches between detecting a read and a write operation with reduced transient current as a result of a non-overlap generator circuit to control read and write signals from being on at a same time.

24. The method of claim 22, wherein said voltage detecting circuit isolates said CEB pin during a read operation so as to draw zero current.

25. The method of claim 22, wherein coupling a plurality of voltages to said CEB pin allows an EEPROM like operation within an EPROM signal pin format.

* * * * *